United States Patent
Manning

(10) Patent No.: US 7,683,456 B2
(45) Date of Patent: *Mar. 23, 2010

(54) SEMICONDUCTOR DEVICES, CAPACITOR ANTIFUSES, DYNAMIC RANDOM ACCESS MEMORIES, AND CELL PLATE BIAS CONNECTION METHODS

(75) Inventor: H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1292 days.

This patent is subject to a terminal disclaimer.

(21) Appl. No.: 11/129,630

(22) Filed: May 13, 2005

(65) Prior Publication Data
US 2005/0207256 A1 Sep. 22, 2005

Related U.S. Application Data

(63) Continuation of application No. 10/753,914, filed on Jan. 7, 2004, now Pat. No. 6,903,437.

(51) Int. Cl.
*H01L 29/00* (2006.01)
(52) U.S. Cl. .................. 257/530; 257/298; 257/299; 257/E27.086; 257/E23.147; 365/225.7; 365/149; 365/200
(58) Field of Classification Search .......... 257/530, 257/E27.086
See application file for complete search history.

(56) References Cited

U.S. PATENT DOCUMENTS

| 4,319,342 | A | * | 3/1982 | Scheuerlein | 365/149 |
| 4,435,793 | A | | 3/1984 | Ochii | 365/233 |
| 5,631,862 | A | | 5/1997 | Cutter et al. | 365/96 |
| 6,115,283 | A | | 9/2000 | Hidaka | 365/149 |
| 6,163,488 | A | | 12/2000 | Tanizaki et al. | 365/200 |
| 6,291,871 | B1 | | 9/2001 | Dennison | 257/530 |
| 6,335,892 | B1 | | 1/2002 | Shirley | 365/225.7 |
| 6,590,237 | B2 | | 7/2003 | Yoo | 257/202 |
| 6,780,683 | B2 | | 8/2004 | Johnson et al. | 438/128 |
| 6,903,437 | B1 | * | 6/2005 | Manning | 257/530 |
| 2002/0089363 | A1 | * | 7/2002 | Fifield et al. | 327/199 |
| 2002/0105845 | A1 | * | 8/2002 | Hidaka | 365/222 |

* cited by examiner

*Primary Examiner*—Tu-Tu V Ho
(74) *Attorney, Agent, or Firm*—Wells St. John, P.S.

(57) ABSTRACT

In one aspect, a semiconductor device includes an array of memory cells. Individual memory cells of the array include a capacitor having first and second electrodes, a dielectric layer disposed between the first and second electrodes. Select individual capacitors are energized so as to blow the dielectric layer to establish a connection between the first and second electrodes such that, after blowing the dielectric layer, the second electrode is coupled to a cell plate generator establishing a bias connection therebetween. Cell plate bias connection methods are also described.

41 Claims, 6 Drawing Sheets

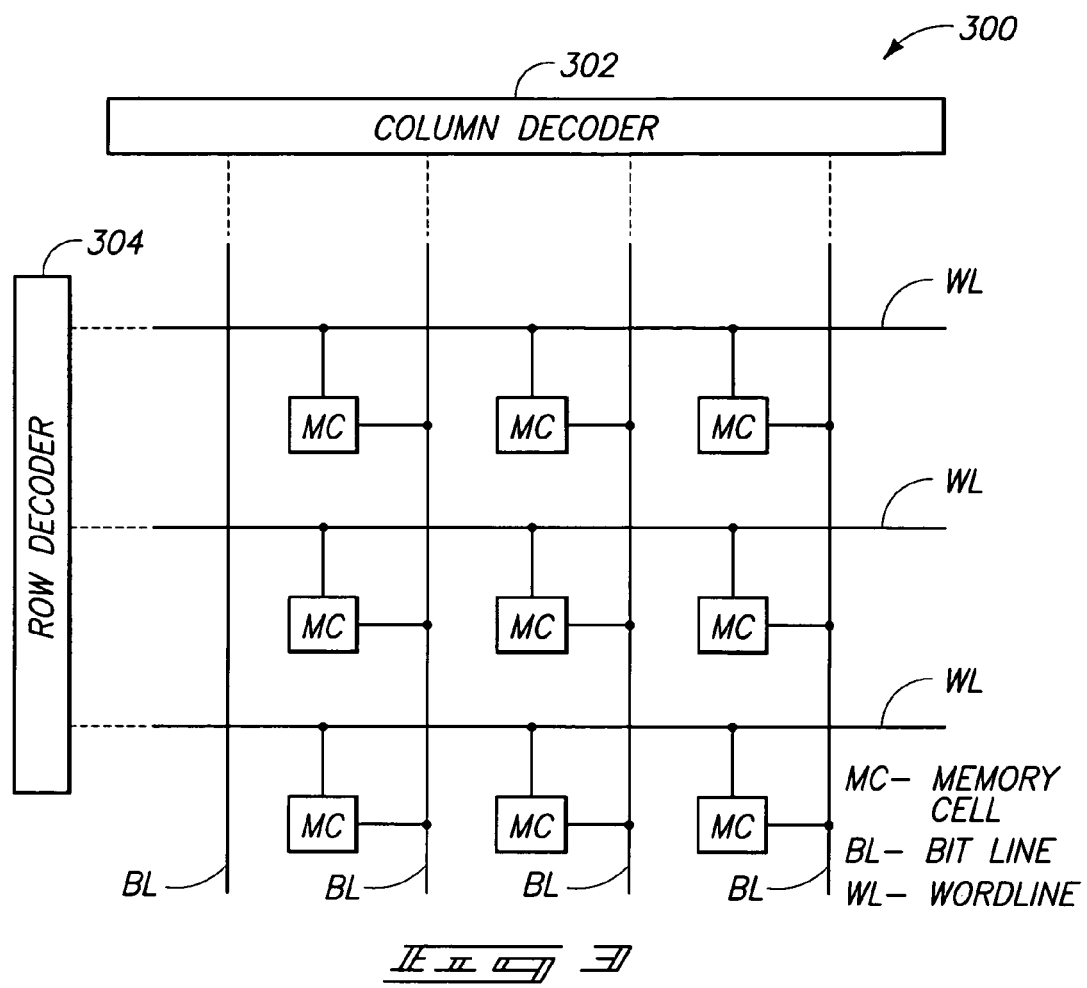
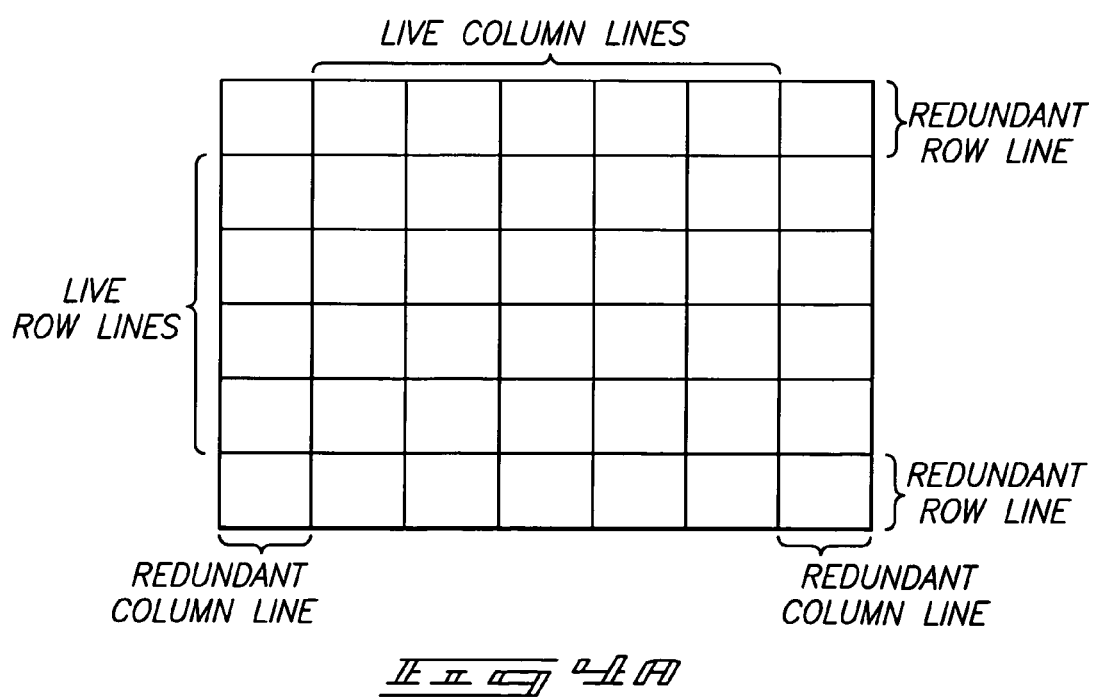

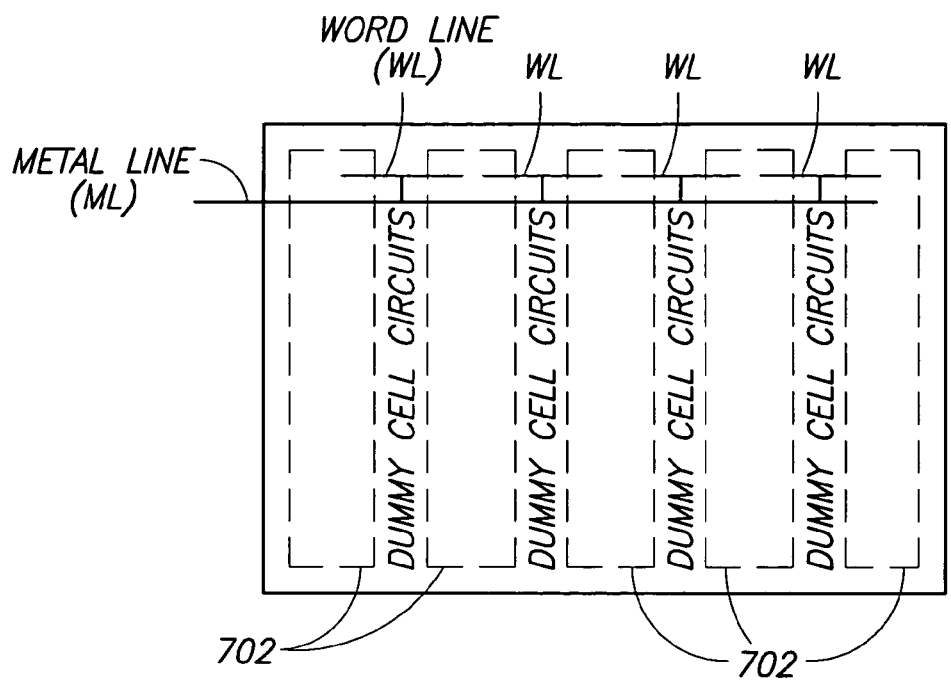
_Fig. 7_
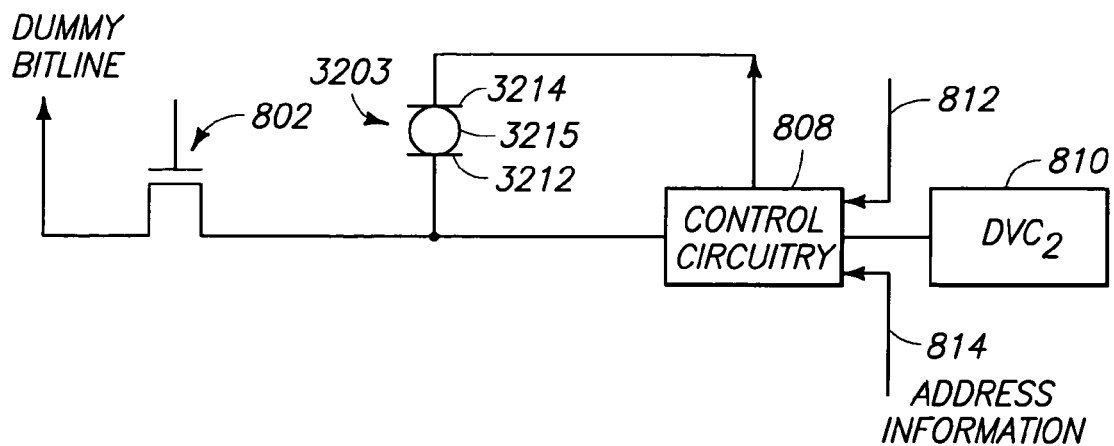
_Fig. 8_

US 7,683,456 B2

SEMICONDUCTOR DEVICES, CAPACITOR ANTIFUSES, DYNAMIC RANDOM ACCESS MEMORIES, AND CELL PLATE BIAS CONNECTION METHODS

RELATED PATENT DATA

This patent is a continuation application of U.S. patent application Ser. No. 10/753,914, filed Jan. 7, 2004, now U.S. Pat. No. 6,903,437 entitled "Semiconductor Devices, Capacitor Antifuses, Dynamic Random Access Memories, and Cell Plate Bias Connection Methods", naming H. Montgomery Manning as inventor, the disclosure of which is incorporated by reference.

TECHNICAL FIELD

The present invention relates to the field of integrated circuits. Aspects of the invention relate to capacitor antifuses, dynamic random access memories, semiconductor devices, and cell plate bias connection methods.

BACKGROUND OF THE INVENTION

Typical DRAM circuits include arrays of memory cells arranged in rows and columns. Each of the rows and columns are driven by a respective row decoder and column decoder. Typically, these memory circuits include several redundant rows and columns that are used as substitutes for defective locations in the memory array.

In the manufacture of integrated circuitry, redundant circuit elements are typically provided in the event not all of the circuitry or components prove operable upon testing. Thus, if some portion of the circuitry is inoperable, backup circuitry is available for proper operation of the integrated circuit. One manner of providing for such circuit redundancy may be achieved via antifuses and redundant circuit logic for activating such antifuses. An antifuse is a component which upon activation or "blowing" creates a short between two conductive elements.

Traditionally, the fuses have been blown by having a laser cut the fuse conductors to remove the conductive paths through the fuses. One problem with such an approach is that the laser cutting of the fuses is time consuming, difficult and imprecise. Therefore, the cost and reliability of memory devices employing laser fuse bank circuits can be less than satisfactory.

More recently, memory devices have been employing antifuse banks in place of conventional fuses. Antifuses are capacitive-type structures that, in their unblown states, form open circuits. Antifuses may be blown by applying a high voltage across the antifuse. The high voltage causes the capacitive-type structure to break down, forming a conductive path through the antifuse. Therefore, blown antifuses conduct and unblown antifuses do not conduct.

Antifuses are similar in construction to capacitors, as evidenced by FIG. 1. There illustrated are portions of a semiconductor wafer 100 in process. The left or "A" portion of the FIG. 1 illustrates a capacitor construction, whereas the right or "B" portion illustrates an antifuse. More specifically, wafer fragment 100 is comprised of a bulk substrate 102, diffusion regions 104 and 106 and field oxide regions 108. An insulator layer 120 is provided over substrate 102, with contacts 122 and 124 being provided therethrough to diffusion regions 104 and 106, respectively. Referring specifically to the capacitor construction of the "A" portion, such is comprised of a patterned electrically conductive storage node 126, an intervening dielectric layer 128, and an overlying capacitor cell layer 130. Referring to the antifuse "B" side of FIG. 1, such is comprised of a lower conductive inner antifuse plate 130 and an outer antifuse plate 132. These are separated and electrically isolated from one another by an intervening antifuse dielectric element 134. Accordingly, a capacitor and antifuse are similar to one another in that two conductive elements are separated by dielectric material.

To "blow" the antifuse, a certain level of quanta of charge is passed through fuse dielectric 134 to cause a physical breakdown of intervening dielectric element 134. Such creates permanent electrically conductive paths between elements 132 and 130, thus forming a desired electrically conductive short. While redundant repair is one goal associated with the blowing of antifuses, as is known in the art, antifuses may be blown e.g., to change the state of another signal associated with a bad column, or to lessen defect currents, etc. Further details regarding antifuse and capacitor construction is shown in U.S. Pat. No. 6,291,871, commonly assigned to the assignee of this application, the entire contents of which are incorporated herein by reference.

FIG. 2 illustrates in cross-section exemplary DRAM circuitry 200. For purposes of illustration, a single memory cell of an array using typical bit line circuitry is shown. Reference numeral 206 refers to a masking step wherein typical polysilicon contacting openings are created for the initial poly plugs to a source/drain region which connects to the capacitor side. Bit lines 210 are thereafter fabricated. Reference numeral 208 refers to the mask step for creating another set of mask openings which connect with plugs (e.g., 206) for connecting with individual storage nodes of respective capacitors 203.

A memory cell of DRAM circuitry constitutes a word line having a pair of source/drain regions. One of the source/drain regions connects to a bit line. The other of the source/drain regions connects to a capacitor. More specifically, the direct connection to the capacitor from the source/drain region is to one of the electrodes of the capacitor, commonly called a storage node of an individual capacitor. The opposing plate of the capacitor is referred to as a cell plate. The cell plates of all the capacitors in a sub-array of a DRAM circuit are all connected together and provided at the same potential (e.g., Vcc/2, commonly referred to as "DVC2").

Peripheral circuitry of the DRAM circuitry 200 is identified with reference numeral 202. The illustrated contact openings show a typical prior art problem in establishing current connection to the cell plate layer as well as to circuitry in the periphery. Depth of etch "d1" to the peripheral circuitry 202 is considerably greater than depth of etch "d2" to the cell plate layer 204 in the sub-array. Such variation creates fabrication problems when etching is performed to different depth layers using the same mask. During the performance of such etching using a single mask, one may encounter cell plates prior to reaching the peripheral circuitry and thereby posing a risk of punching through the cell plate layer and shorting to underlying circuitry.

It would be desirable to overcome the above-identified problems.

SUMMARY OF THE INVENTION

Aspects of the invention relate to capacitor antifuses, dynamic random access memories, semiconductor devices, and cell plate bias connection methods.

In one aspect, a semiconductor device includes an array of memory cells. Individual memory cells of the array include a capacitor having first and second electrodes, a dielectric layer disposed between the first and second electrodes. Select individual capacitors are energized so as to blow the dielectric layer to establish a connection between the first and second electrodes such that, after blowing the dielectric layer, the second electrode is coupled to a cell plate generator establishing a bias connection between the cell plate generator and the second electrode.

In another aspect, a dynamic random access memory device includes an array of operable memory cells, and redundant circuitry provided in locations peripheral to the array of operable memory cells. The redundant circuitry is provided at elevationally lower levels when compared to the array of operable memory cells. Individual capacitors of the array of operable memory cells include a capacitor antifuse, the capacitor antifuse includes a storage node, a cell plate, and a dielectric layer disposed between the storage node and the cell plate. The capacitor antifuse is biased so as to blow the dielectric layer to establish a connection between the cell plate and a cell plate generator without requiring a shallow etch to the cell plate.

In yet another aspect, a capacitor antifuse device includes a storage node, a cell plate, and a dielectric layer disposed between the storage node and the cell plate. The storage node is energized so as to blow the dielectric layer to establish a connection between the storage node and the cell plate such that, after blowing the dielectric layer, a bias connection is established from the cell plate to a cell plate generator without requiring an etch to the cell plate.

In a further aspect, a dynamic random access memory includes a plurality of sub-arrays of memory cells, wherein select individual memory cells of the plurality of sub-arrays include a capacitor antifuse having a cell plate, a storage node, and a dielectric layer disposed between the cell plate and the storage node. The capacitor antifuse is biased to permit flow of charge through the dielectric layer to rupture the dielectric layer and provide bias connection to the cell plate without performing an etch to the cell plate.

In a further another aspect, a computer system includes a data input device, a data output device, and an address bus. The computer system also includes a computing circuitry coupled to the data input device, the data output device, and the address bus. The computing circuitry further includes a memory device having a dynamic random access memory configured to perform memory functions. The dynamic random access memory includes an array of operable memory cells, and redundant circuitry provided in locations peripheral to the array of operable memory cells. The redundant circuitry is provided at elevationally lower levels when compared to the array of operable memory cells. Individual memory cells of the array of operable memory cells include a capacitor antifuse. The capacitor antifuse includes a storage node, a cell plate, and a dielectric layer disposed between the storage node and the cell plate. The capacitor antifuse is biased so as to blow the dielectric layer to establish a connection between the storage node and the cell plate such that, after blowing the dielectric layer, the cell plate is coupled to a cell plate generator, and wherein a bias connection is provided to the cell plate without requiring a shallow etch to the cell plate.

In yet another aspect, a cell plate bias connection method in a dynamic random access memory is described. The method includes providing a plurality of sub-arrays of memory cells with an array, wherein individual memory cells of the plurality of sub-arrays include a capacitor antifuse which includes a cell plate, a storage node, and a dielectric layer disposed between the cell plate and the storage node. The method also includes biasing individual capacitor antifuses of select memory cells of the array, blowing the dielectric layer of the individual capacitor antifuses of the select memory cells by the biasing, and providing a bias connection from a cell plate generator to the cell plate of the individual capacitor antifuses of the select memory cells by the blowing.

BRIEF DESCRIPTION OF THE DRAWINGS

Preferred embodiments of the invention are described below with reference to the following accompanying drawings.

FIG. 3 shows a memory cell array having a plurality of memory cells MC arranged in a matrix, a word line WL corresponding to each row, and a bit line BL corresponding to each column in accordance with some embodiments.

FIGS. 4A-4B show top down diagrammetric views of a sub-array of a memory cell array shown in FIG. 3.

FIG. 7 shows a top view schematic of dummy cell circuitry to illustrate that dummy cell circuitry shown in FIG. 6 may also be centrally located within the sub-array, in accordance with some embodiments.

FIG. 8 is a circuit schematic of a memory cell and an antifuse capacitor in accordance with some embodiments of the present invention.

DETAILED DESCRIPTION OF THE PREFERRED EMBODIMENTS

FIG. 3 shows a memory cell array 300 having a plurality of memory cells MC arranged in a matrix, a word line WL corresponding to each row, and a bit line BL corresponding to each column. Each memory cell includes a MOS transistor device (e.g., n-channel or p-channel) for access and a capacitor for storage of information. Addressing of memory cells of the matrix is performed by row and column decoders 304, 302, respectively. Word line WL transmits an output from row decoder 304 to activate memory cells MC of a selected row. The bit line BL is configured to input and output a data signal to and from a selected memory cell MC. The cell plate is typically connected to power supply circuitry (e.g., DVC2, an intermediate reference voltage between Vcc and ground) via a contact from an overlying conductor. Such a connection may also occur with some peripheral circuitry which typically has its devices fabricated at lower levels within the array. DRAM operation and a cell plate generator that provides a DVC2 voltage are described, for example, in U.S. Pat. No. 5,500,824 to Fink, which is incorporated herein by reference in its entirety.

Figure 4B:
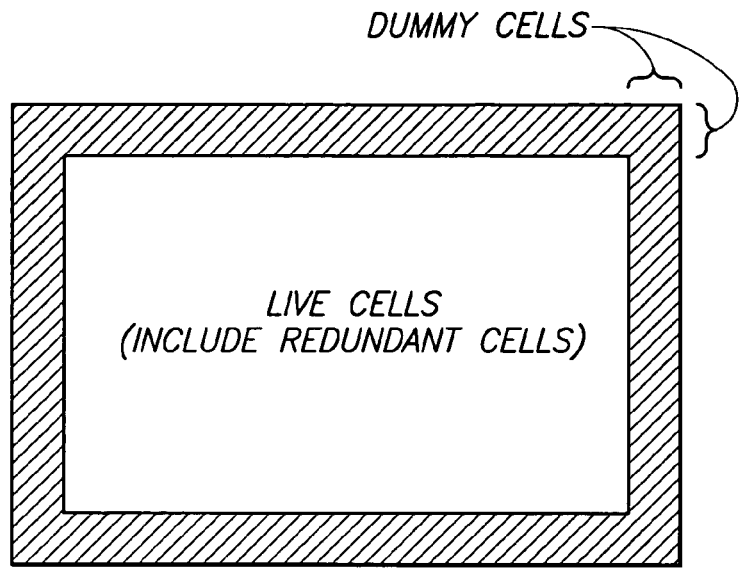

FIGS. 4A-4B show top down diagrammetric views of a sub-array of a memory cell array shown in FIG. 3. For purposes of this discussion, a sub-array may be defined as an area of closely packed memory cells wherein cell plates of individual memory cells are connected as a single cell plate. Central area of FIG. 4B includes live memory cells and redundant cells, the redundant cells being configured in rows and columns (e.g., redundancy rows and columns). For example, in some embodiments, during fabrication of DRAM circuitry, 1% or slightly less than all of the memory cells in the sub-array may be created to be redundant, and the redundant cells (e.g., redundant rows/columns) may be fabricated at the edges of operable intended circuitry of the "live" sub-array.

In the event that some inoperable memory cells (e.g., bad memory cells) are discovered in the individual sub-arrays, then backups may be provided to such bad memory cells by programming redundancy elements in the periphery circuitry. One example of this is performed by blowing select antifuse capacitors (e.g., by blowing dielectric layer of a capacitor thereby shorting capacitor electrodes) of the redundant circuitry (e.g., redundant rows and columns), thereby rerouting specific addresses to redundant columns/rows instead of the inoperable memory cells. Changes may only occur in the periphery redundant circuit antifuse capacitors. It will be appreciated that the antifuse capacitors in the redundant circuitry are separate from antifuse capacitors used to connect a cell plate (e.g., cell plate 3214 as shown in FIG. 8).

In one embodiment, contacts to the cell plate (e.g., cell plate 2214) may be different from the contacts that extend to the other logic and circuits of the DRAM circuitry. For example, the redundant circuitry includes capacitors that are formed using the same processing method used to form the memory arrays.

Blowing an antifuse or blowing a capacitor antifuse or blowing a capacitor generally referred to herein means enabling flow of charge through the dielectric layer of a capacitor thereby shorting the capacitor electrodes. Capacitors may be alternatively referred to herein as antifuse capacitors or capacitor antifuses. One of the capacitor electrodes is referred to herein as a cell plate (e.g., cell plate 2214) while the other electrode is referred to as a storage node (e.g., storage node 2212). Thus, blowing the antifuse or blowing the capacitor creates a short between the cell plate and the storage node of a select capacitor (e.g., capacitor 2203).

Figures 1A, 1B:
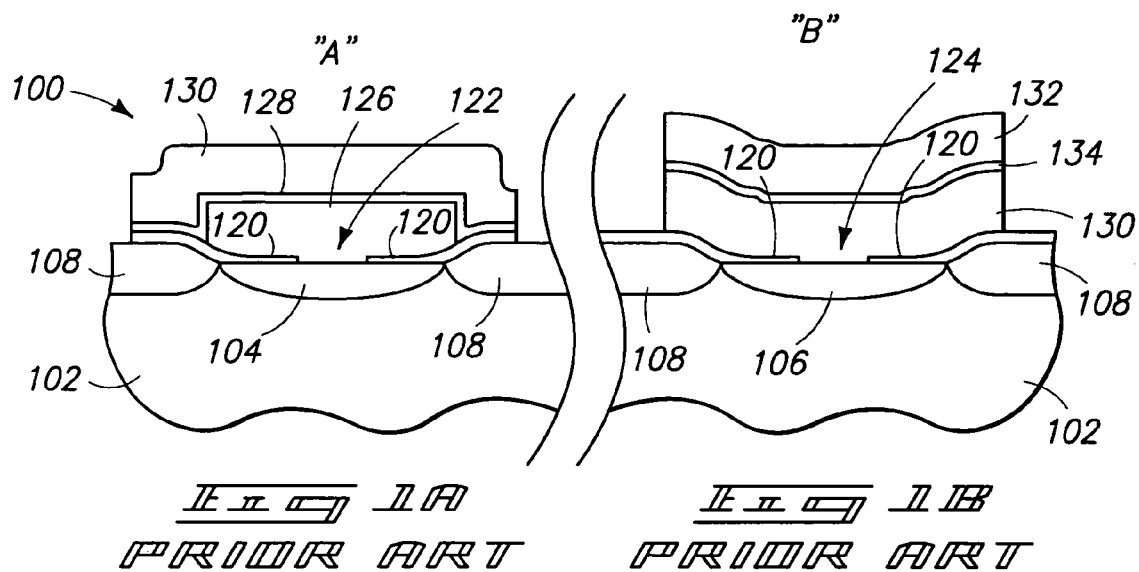
FIGS. 1A-1B are a diagrammatic sectional view of a prior art wafer fragment.
Figure 2:
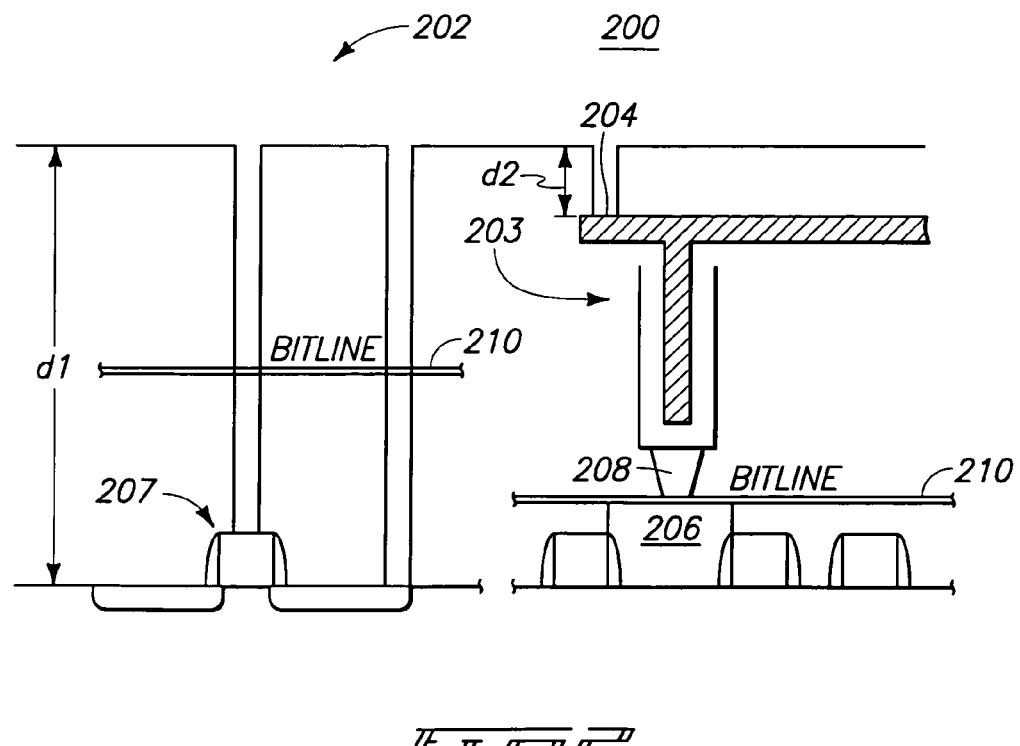
FIG. 2 is a cross-section of a typical DRAM circuitry showing an etch to cell plate as well as a deep etch to peripheral circuitry of a memory cell array.
Figure 5:
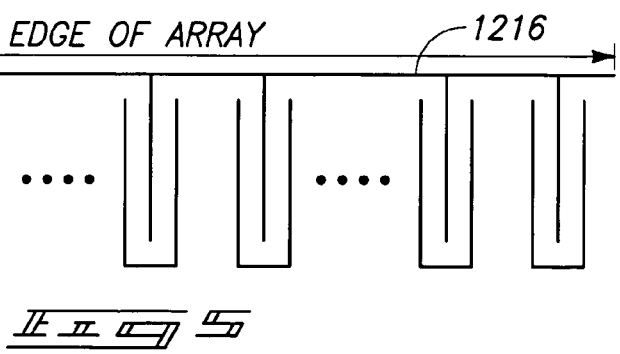
FIG. 5 is a schematic illustrating an array of memory cells in accordance with some embodiments.

FIG. 5 is a schematic illustrating an array of memory cells wherein reference numerals like those identified with regard to FIG. 2 are identified with like reference numerals but with a prefix "1" added. The array shown in FIG. 5 includes exemplary memory cells 1203 formed at edges of the array. Photolithographic artifact effects result in a transition area between tightly packed common construction circuitry such as, for example, tightly packed memory arrays and peripheral circuitry, or at least where the tightly packed processing stops. Unfortunately, at the edges of the sub-arrays, the mask patterns of various circuitry do not transfer very well resulting in operable or bad memory cells or devices. Accordingly, the edges of the sub-arrays are fabricated with what are referred to as dummy cells.

Figure 6:
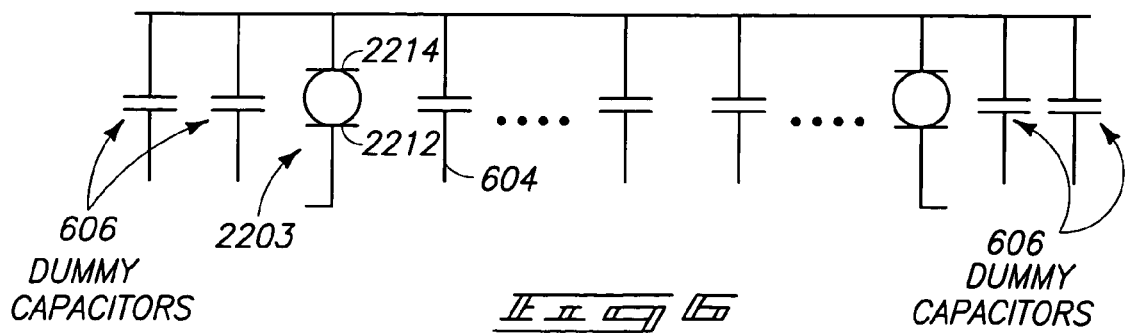
FIG. 6 is an exemplary schematic illustrating dummy cells in a sub-array of a memory cell array in accordance with some embodiments.

FIG. 6 is an exemplary schematic illustrating dummy cells in a sub-array of a memory cell array, shown in FIG. 4A, in accordance with some embodiments of the invention wherein reference numerals like those identified with regard to FIG. 2 are identified with like reference numerals but with a prefix "2" added. The memory cell array shown in FIG. 6 includes dummy cells or capacitors 606 along with live memory cells 604 and antifuse capacitors 2203. Select ones of antifuse capacitors 2203 are blown in order to establish continuity between lower electrode 2212 and cell plate 2214 of select capacitors (e.g., capacitor 2203) thereby negating the need for shallow contacts to the cell plate 2214. Lower and upper electrodes of a capacitor are alternatively referred to herein as a storage node (e.g., storage node 2212) and a cell plate (e.g., cell plate 2214), respectively.

In the exemplary memory cell array shown in FIGS. 4A-4B and the embodiments shown in FIGS. 5-6, the cell plates or upper electrodes of individual capacitors are commonly connected to a single electrode or a common electrode. Accordingly, all the cell plates or upper electrodes are held at a common potential. Also, individual capacitors of the memory cell array may be configured as dummy antifuse capacitors that are inherently fabricated in a semiconductor device comprising the memory cell array.

FIG. 7 shows a top view schematic of dummy cell circuitry to illustrate that the dummy cell circuitry 702 is not necessarily restricted to periphery area of a sub-array, and that it may also be centrally located within the sub-array. The word lines WL may be fabricated of polysilicon/silicide and are configured to be disjointed and not continuous in a row in accordance with one exemplary embodiment of the present invention. Immediately adjacent to the word lines WL, a metal line ML is fabricated and connections are made to individual spaced word line segments. Such may be performed in order to increase conductivity/current flow to the word lines when compared to continuously running word lines across the sub-array.

FIG. 8 is a circuit schematic of a memory cell and an antifuse capacitor in accordance with some embodiments of the present invention wherein reference numerals like those identified with regard to FIG. 2 are identified with like reference numerals but with a prefix "3" added. The circuit schematic of the memory cell includes a transistor 802 having a source/drain region connected to storage node or lower electrode 3212 of antifuse capacitor 3203. A single memory cell is shown for simplicity. As such, a plurality of such memory cells may be present in a memory cell array. The antifuse capacitor 3203 also includes a dielectric 3215 and a cell plate 3214. The dielectric 3215 is disposed between the storage node 3212 and the cell plate 3214. The circuit schematic also includes a control circuitry 808, a voltage supply (e.g., DVC2) 810. In one case, Vcc is held at a potential of 2.5 volts, and DVC2 (i.e., Vcc/2) is accordingly held at 1.25 volts. The control circuitry 808 receives as inputs a fuse blow voltage 812 from a voltage source and address information 814. The control circuitry 808 uses the fuse blow voltage 812 to blow (e.g., short) the dielectric layer 3215 of the antifuse capacitor 3203 to establish contact with the cell plate 3214. The control circuitry 808 provides a signal indicating that a select antifuse capacitor (e.g., capacitor 3203) should be blown (e.g., ruptured or shorted) at a particular time. Control circuitry 808 energizes storage node 3212 of the antifuse capacitor 3203 through the cell plate 3214. A fuse blow voltage that is sufficient to blow the dielectric layer 3215 is applied by control circuitry 808 such that thereafter the cell plate 3214 is coupled to DVC2 810. For example, the dielectric of a select antifuse capacitor is blown when the select antifuse capacitor is charged by a power supply.

In another case, a voltage may be applied between two opposing antifuse storage nodes such that dielectric layers of both the antifuse storage nodes are blown, leaving a cell plate therebetween and establishing a contact thereto. The voltage required to perform such an operation may be double the voltage required for the case where a dielectric layer (e.g., 3215) of a single antifuse capacitor (e.g., 3203) is blown, thereby establishing a contact to the cell plate (e.g., 3214).

The blowing of dielectric 3215 creates a short between the cell plate 3214 and the storage node 3212, thereby creating a connection path from the cell plate 3214 to DVC2 810 (e.g., cell plate generator). The control circuitry 808 may also be configured to be outside the connection path connecting the cell plate 3214 to DVC2 810 in other embodiments. Input 814 to the control circuitry 808 may be used to provide a signal indicating that a select antifuse capacitor (e.g., capacitor 3203) should be blown (e.g., shorted) at a particular time to establish a connection path between a cell plate (e.g., cell plate 3214) and DVC2 810. Input 814 to the control circuitry 808 may also be used carry address information to selectively identify antifuse capacitors in the array in order to blow the dielectric layers of the selected antifuse capacitors to create a connection path between cell plates of such selected antifuse capacitors and DVC2 810 (e.g., cell plate generator).

Prior to the blowing of the dielectric layer 3215, the storage node or lower electrode 3212 is tied to DVC2 voltage. After blowing the dielectric layer 3215, a short is created between the cell plate 3214 and the storage node 3212, thereby connecting and biasing the cell plate 3214 to DVC2 voltage. Accordingly, a shallow etch to the cell plate 3214 configured at a shallow depth "d2", compared to depth "d1" (e.g., elevationally lower or deeper) where storage node 3212 is provided, in order to connect cell plate 3214 to DVC2 (e.g., cell plate generator) is no longer required, thereby overcoming the earlier encountered problems with regard to varying contact depths.

Figure 9A:
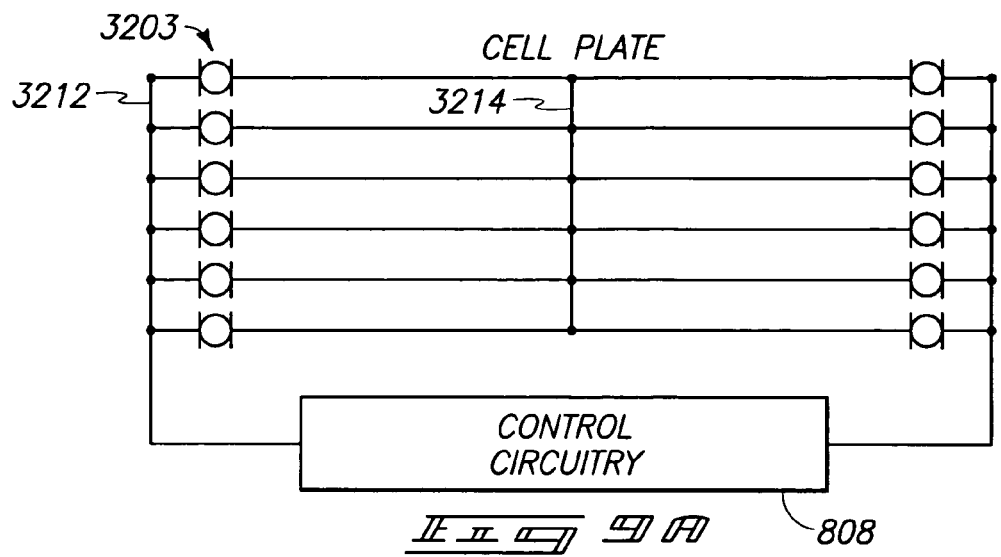
FIGS. 9A-9C illustrate various schematics of connecting control circuitry to storage nodes of various antifuse capacitors in accordance with various embodiments of the present invention.
Figure 9B:
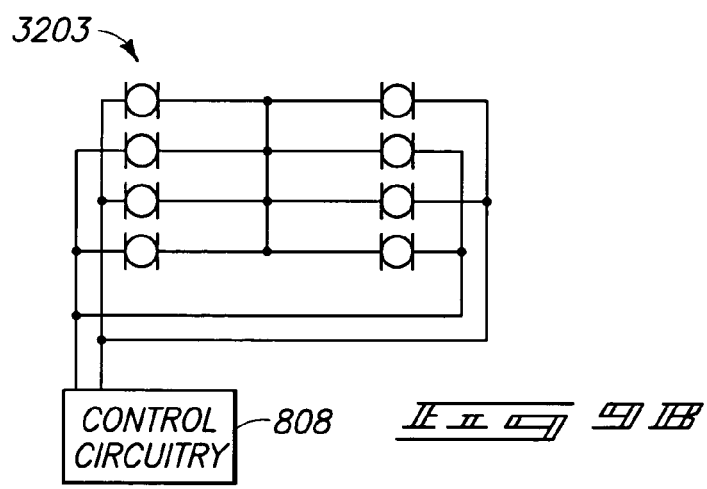
Figure 9C:
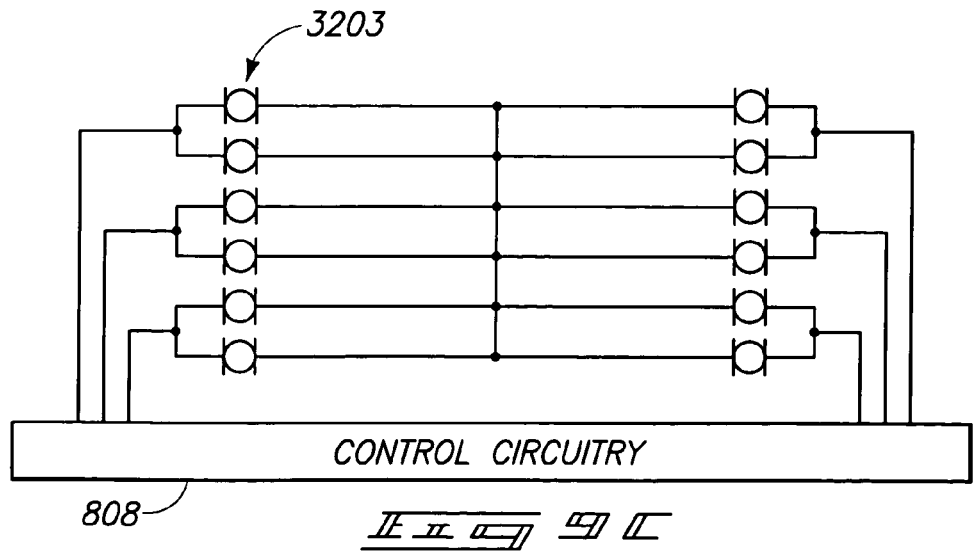

FIGS. 9A-9C illustrate various schematics of connecting control circuitry to storage nodes of various antifuse capacitors in accordance with various embodiments of the present invention.

FIG. 9A schematically shows a configuration wherein a first sub-set of storage nodes of antifuse capacitors are connected to another sub-set of storage nodes of antifuse capacitors within a memory cell array. For example, the array shown in FIG. 9A includes a plurality of antifuse capacitors 3203, wherein the cell plates 3214 of individual capacitors are commonly connected. The storage nodes 3212 of the individual antifuse capacitors 3203 are connected to control circuitry 808. Such respective connections may be to half of all the storage nodes within the array, or some sub-portion thereof. Regardless, applying a voltage potential to the storage nodes 3212 on one side of the control circuitry 808 and another suitable different voltage potential on the other side of the control circuitry 808 enables blowing of at least some of the antifuse capacitors 3203 thereby establishing a connection to the cell plate 3214 via the blown capacitors. Also, a connection is established via the control circuitry 808 to bias the cell plate 3214 to a potential of DVC2 as noted above with regard to FIG. 8.

However, after a connection path is established to the cell plate 3214, and in the event that the existing connection is insufficient, it may be difficult to cause blowing of more antifuse capacitors in addition to the ones that are already blown. If adequate number of antifuse capacitors are not blown to provide an adequate connection to the cell plate 3214, such may be provided by way of another circuit configuration shown for example in FIGS. 9B and 9C which illustrate various other embodiments of the present invention. Aspects of the invention are applicable to capacitors that are built above as well as below CMOS periphery circuitry elements. It should be understood that although aspects of the invention have been described with respect to a stacked capacitor process, they could be implemented in a trench capacitor process as well.

Instead of blowing antifuses capacitors across an entire row of a sub-array, alternate antifuse capacitors are configured for blowing on a same side of the sub-array as shown in FIG. 9B. FIG. 9C shows another embodiment of the present invention wherein antifuse capacitors are blown in sections. For example, a top third of the array may be considered and antifuses may be blown across the middle of the top third of the array. Likewise, antifuses may be blown for the next third of the array and so on and so forth. It will be appreciated that instead of considering the sections as a third of the array, quarter sections or other convenient number of sections may be configured to obtain a higher percentage of antifuses that may be blown.

Figure 10:
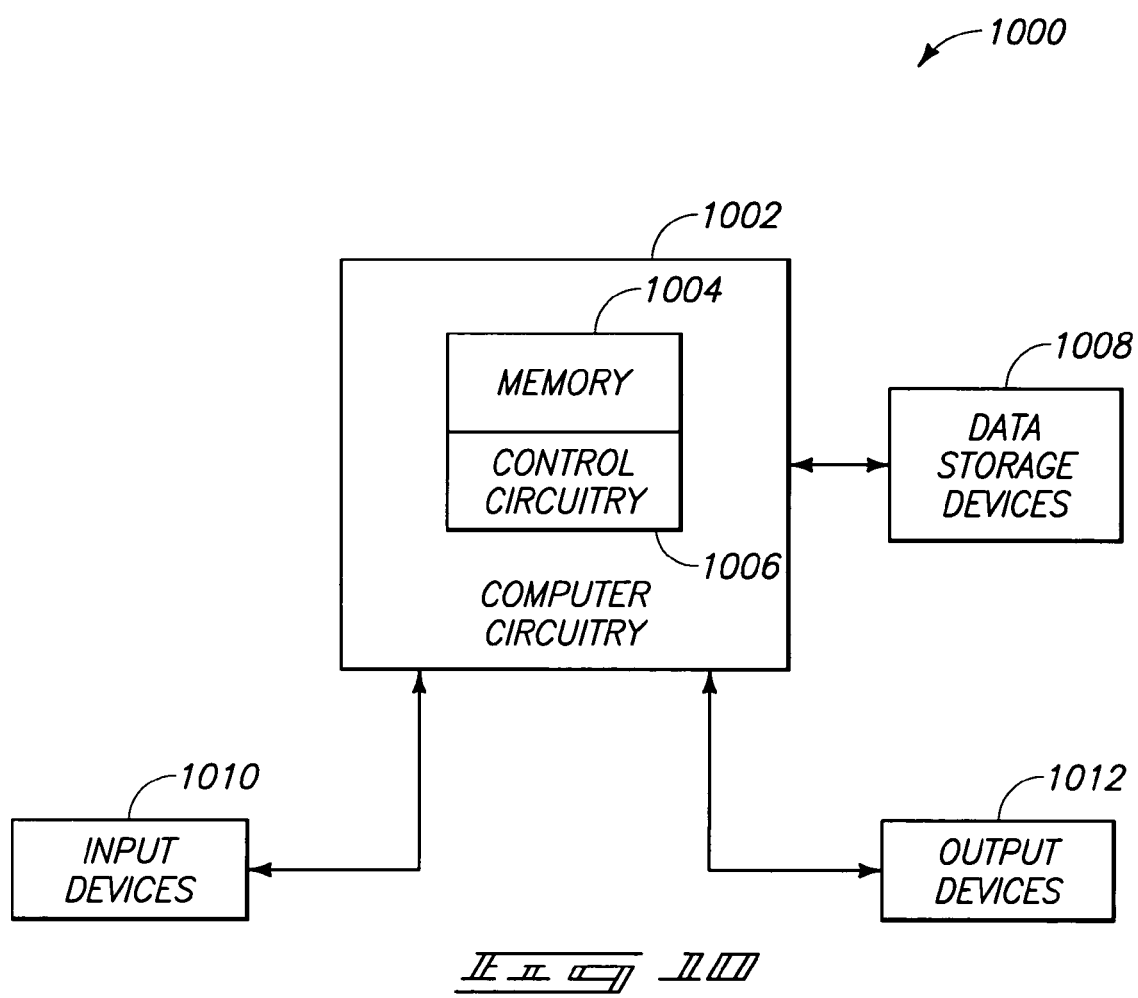
FIG. 10 is a block diagram of a computer system having a DRAM using an antifuse circuit for providing cell plate bias connection in accordance with an embodiment of the present invention.

FIG. 10 is a block diagram of a computer system 1000 employing a memory device 1004 having a computer circuitry 1002 for performing computer functions, such as executing software to perform desired calculations and tasks. In one exemplary case, memory device 1004 may be a DRAM configured to perform memory functions and comprised in memory cell array 300 (FIG. 3). The computer circuitry 1002 typically contains a processor or control circuit 1006 and the memory 1004 as shown.

One or more input devices 1010, such as a keypad or a mouse, are coupled to the computer circuitry 1002 and allow an operator to manually input data thereto. One or more output devices 1012 are coupled to the computer circuitry 1002 to display or otherwise output data generated by the computer circuitry 1002. Examples of output devices include a printer and a video display unit. One or more data storage devices 1008 are coupled to the computer circuitry 1002 to store data on or retrieve data from external storage media (not shown). Examples of storage devices 1008 and storage media include drives that accept floppy disks, tape cassettes, and compact-disk read only memories.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor device, comprising:
an array of memory cells, at least some of the memory cells of the array respectively including a capacitor having a storage node electrode, a cell plate electrode, and a dielectric layer disposed between the storage node electrode and cell plate electrode, at least some of the capacitors of the array being configured such that the dielectric layer is selectively blown to establish a connection between the storage node and cell plate electrodes such that, after blowing the dielectric layer, the cell plate electrode is coupled to a cell plate generator, thereby establishing a coupling between the cell plate generator and the cell plate electrode.

2. The semiconductor device of claim 1, wherein at least some of the capacitors are defined by antifuses.

3. A semiconductor device comprising:
an array of memory cells, at least some of the memory cells of the array including respective capacitors having first and second electrodes and having a dielectric layer disposed between the first and second electrodes; and
redundant circuitry located at peripheral edges of the array of memory cells and elevationally at a greater depth compared to the array of memory cells such that a depth of etch to the redundant circuitry is greater than a depth of etch to the second electrode of at least some of the capacitors, at least some of the capacitors of the array being configured such that the dielectric layer of the capacitor is selectively blown to establish a coupling between the first and second electrodes such that, after blowing the dielectric layer, the second electrode is coupled to a cell plate generator, thereby establishing a coupling between the cell plate generator and the second electrode without requiring an etch to the second electrode of the select individual capacitors.

4. The semiconductor device of claim 3, wherein at least some of the capacitors are formed in a periphery of the array of memory cells.

5. The semiconductor device of claim 3, wherein at least some of the capacitors are formed centrally within the array of memory cells.

6. The semiconductor device of claim 3, wherein at least some of the capacitors are defined by antifuses.

7. The semiconductor device of claim 2, further comprising a control circuit configured to control a voltage supplied to at least some of the capacitors in order to blow the dielectric layer of selected capacitors coupled to the control circuit.

8. The semiconductor device of claim 2, wherein the dielectric layer of selected capacitors is blown when the selected capacitors are charged by a voltage source.

9. The semiconductor device of claim 2, wherein the coupling between the storage node and cell plate electrodes of capacitors is made by enabling flow of charge through the dielectric layer.

10. The semiconductor device of claim 2, wherein the cell plate electrodes of at least some of the capacitors are coupled to a common electrode.

11. The semiconductor device of claim 10, wherein the array of memory cells comprises a plurality of sub-arrays of memory cells.

12. The semiconductor device of claim 11, further comprising word lines and bit lines, wherein the word lines are fabricated of polysilicon and are disjointed in a row from word lines of other sub-arrays of the memory cells.

13. The semiconductor device of claim 12, further comprising a metal line, wherein connections are made to spaced word line segments of the individual sub-arrays by connecting word line segments to the metal line to increase conductivity.

14. The semiconductor device of claim 12, wherein the plurality of sub-arrays are configured such that capacitors of the memory cells, located on a side of sub-arrays having memory cells, are blown to achieve a desired connection to commonly connected cell plate electrodes of the capacitors.

15. The semiconductor device of claim 12, wherein the plurality of sub-arrays are configured as a plurality of sections of sub-arrays, and wherein capacitors located in select sections of the sub-arrays are blown to obtain a desired connection to commonly connected cell plate electrodes of the respective capacitors located in the select sections.

16. A dynamic random access memory device, comprising:
an array of memory cells;
redundant circuitry provided in locations peripheral to the array of memory cells, the redundant circuitry provided at elevationally lower levels when compared to the array of memory cells, wherein individual capacitors of the array of memory cells include a capacitor antifuse, the capacitor antifuse including:
a storage node;
a cell plate; and
a dielectric layer disposed between the storage node and the cell plate; and
wherein the capacitor antifuse is biased so as to blow the dielectric layer to establish a connection between the cell plate and a cell plate generator, wherein a bias connection is provided to the cell plate without requiring an etch to the cell plate.

17. The device of claim 16, wherein the dielectric layer is blown by charging the antifuse capacitor with a predetermined charge, and wherein the storage node is biased by a voltage source via a control circuit configured to regulate a voltage supplied by the voltage source.

18. The device of claim 16, wherein respective cell plates of individual ones of capacitor antifuses of the memory cells of the array are connected to a common electrode, and wherein a depth of etch to the redundant circuitry is greater than a depth of etch to the cell plate.

19. The device of claim 16, wherein select ones of the capacitor antifuses comprise dummy antifuse capacitors.

20. The device of claim 16, wherein the array comprises a plurality of sub-arrays of memory cells, individual ones of the plurality of sub-arrays comprise word lines and bit lines, and word lines of the individual sub-arrays are configured to be disjointed in a row from word lines of other sub-arrays.

21. The device of claim 20, further comprising:
a metal line; and
wherein connections are made to spaced word line segments of the individual sub-arrays by connecting individual word line segments to the metal line.

22. The device of claim 21, wherein connection of the individual word line segments to the metal line is configured to increase conductivity to the word line segments when compared to polysilicon word lines configured to be continuous across the sub-arrays.

23. The device of claim 16, wherein after blowing the dielectric layer, the cell plate is provided at voltage potential corresponding to a DVC2 level.

24. A dynamic random access memory, comprising:
a plurality of sub-arrays of memory cells, select individual memory cells of the plurality of sub-arrays include a capacitor antifuse having a cell plate, a storage node, and a dielectric layer disposed between the cell plate and the storage node; the capacitor antifuse being configured to be biased to permit a flow of charge through the dielectric layer to rupture the dielectric layer and provide a bias connection from a cell plate generator to the cell plate without need for performing an etch to the cell plate.

25. The memory of claim 24, wherein the capacitor antifuse is biased via a control circuitry configured to regulate voltage provided to the capacitor antifuse to rupture the dielectric layer.

26. The memory of claim 24, wherein cell plates of individual capacitor antifuses of the plurality of sub-arrays are connected to a common electrode.

27. The memory of claim 24, further comprising redundant circuitry having memory cells, the redundant circuitry being configured to provide backup to the plurality of sub-arrays of memory cells.

28. The memory of claim 27, wherein the redundant circuitry is formed at increased depths when compared to a depth at which the plurality of sub-arrays of memory cells are formed, and wherein bias connection to the cell plate of the capacitor antifuse eliminates a shallow etch to the cell plate.

29. The memory of claim 28, wherein an etch to the redundant circuitry eliminates the shallow etch to the cell plate.

30. A computer system comprising:
   a data input device;
   a data output device;
   an address bus; and
   computing circuitry coupled to the data input device, the data output device, and the address bus, the computing circuitry including a memory device having a dynamic random access memory configured to perform memory functions, wherein the dynamic random access memory includes:
      an array of operable memory cells;
      redundant circuitry provided in locations peripheral to the array of operable memory cells, the redundant circuitry provided at elevationally lower levels when compared to the array of operable memory cells, and wherein individual memory cells of the array of operable memory cells include a capacitor antifuse, the capacitor antifuse including:
         a storage node;
         a cell plate; and
         a dielectric layer disposed between the storage node and the cell plate; and
      wherein the capacitor antifuse is selectively biased so as to blow the dielectric layer to establish a connection between the storage node and the cell plate such that, after blowing the dielectric layer, a bias connection is provided to the cell plate from a cell plate generator.

31. The system of claim 30, wherein respective cell plates of individual ones of capacitor antifuses of the memory cells of the array are connected to a common electrode.

32. A cell plate bias connection method in a dynamic random access memory, the method comprising:
   providing a plurality of sub-arrays of memory cells with an array, at least some of the memory cells of the plurality of sub-arrays including a capacitor antifuse, the capacitor antifuse having a cell plate, a storage node, and a dielectric layer disposed between the cell plate and the storage node;
   biasing individual capacitor antifuses of select memory cells of the array;
   blowing the dielectric layer of the individual capacitor antifuses of the select memory cells by the biasing; and
   providing a bias connection from a cell plate generator to the cell plate of the individual capacitor antifuses of the select memory cells by the blowing.

33. The method of claim 32, wherein providing the bias connection to the cell plate by the blowing prevents performing a shallow etch to the cell plate of the individual capacitor antifuses.

34. The method of claim 32, wherein the blowing comprises charging the individual capacitor antifuses to enable flow of charge through the dielectric layer of the individual capacitor antifuses of the select memory cells.

35. The method of claim 32, further comprising providing redundant circuitry in the array at edges of operable memory cells of the plurality of sub-arrays of the array.

36. The method of claim 35, further comprising forming word lines and bit lines, wherein the word lines of the plurality of sub-arrays are formed in a disjointed manner from word lines of other sub-arrays.

37. The method of claim 36, further comprising:
   forming a metal line; and connecting spaced word line segments of the plurality of sub-arrays to the metal line.

38. A method of manufacturing a dynamic random access memory device, the method comprising:
   forming an array of operable memory cells;
   forming redundant circuitry in locations peripheral to the array of operable memory cells, wherein the redundant circuitry is provided at elevationally lower levels when compared to the array of operable memory cells, wherein the redundant circuitry is formed such that a depth of etch to the redundant circuitry is greater than a depth of etch to the cell plate of individual ones of the operable memory cells of the array;
   providing a capacitor antifuse device for individual memory cells of the array of operable memory cells, the capacitor antifuse having:
      a storage node;
      a cell plate; and
      a dielectric layer disposed between the storage node and the cell plate;
   coupling the storage node to a voltage source via a control circuit, wherein the control circuit is configured to regulate a voltage supplied by the voltage source; and
   biasing select ones of the antifuse capacitors of the memory cells so as to blow the dielectric layer of the select ones of the antifuse capacitors to establish a connection between the storage node and the cell plate of respective ones of the antifuse capacitors, which provides a bias connection to the cell plate of the respective ones of the capacitor antifuses.

39. The method of claim 38, wherein the biasing comprises energizing the storage node to blow the dielectric layer.

40. The method of claim 39, wherein the biasing further comprises providing a first voltage to the storage node and a different second voltage to the cell plate to enable flow of charge through the dielectric layer.

41. The method of claim 40, further comprising connecting a subset of the storage nodes of select capacitor antifuses in opposing manner such that the dielectric layer of the select capacitor antifuses are blown by providing predetermined potential difference by the control circuit.

* * * * *